(12) United States Patent
Griffin et al.

(10) Patent No.: US 9,015,537 B2
(45) Date of Patent: *Apr. 21, 2015

(54) BIT ERROR RATE BASED WEAR LEVELING FOR SOLID STATE DRIVE MEMORY

(71) Applicant: International Business Machines Corporation, Armonk, NY (US)

(72) Inventors: Thomas J. Griffin, Salt Point, NY (US); Dustin J. Vanstee, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/101,655

(22) Filed: Dec. 10, 2013

(65) Prior Publication Data
US 2014/0101499 A1  Apr. 10, 2014

Related U.S. Application Data

(63) Continuation of application No. 13/355,050, filed on Jan. 20, 2012.

(51) Int. Cl.
*G06F 11/00* (2006.01)
*G11C 29/00* (2006.01)
(Continued)

(52) U.S. Cl.
CPC .......... *G01R 31/3171* (2013.01); *G06F 11/008* (2013.01); *G06F 11/1048* (2013.01); *G11C 16/3495* (2013.01); *G06F 11/076* (2013.01); *G06F 11/1068* (2013.01);
(Continued)

(58) Field of Classification Search
CPC ... G06F 11/16; G06F 11/068; G11C 16/3495; G11C 11/406; G11C 11/1008; G11C 29/50; G11C 29/42; G11C 16/10; G11C 16/14; G11C 16/16; G11C 16/3404; G11C 16/3409; G11C 16/3468; G11C 16/3477; G11C 16/3486; G11C 16/3454; H04L 1/203; H04L 1/0061; G01R 31/3171
USPC ......... 714/704, 718, 736, 746, 754, 759, 760, 714/774, 799
See application file for complete search history.

(56) References Cited

U.S. PATENT DOCUMENTS 7,930,586 B1   4/2011   Asher
8,010,738 B1 *  8/2011   Chilton et al. ................ 711/103
(Continued)

FOREIGN PATENT DOCUMENTS

JP    2008305451 A2   12/2008
WO   WO2006033099 A2   3/2000

OTHER PUBLICATIONS

J. Kong, et al., "Improving Privacy and Lifetime of PCM-Based Main Memory," Jul. 2010; IEEE; pp. 1-10.
(Continued)

*Primary Examiner* — John J Tabone, Jr.
(74) *Attorney, Agent, or Firm* — Cantor Colburn LLP; Margaret McNamara

(57) ABSTRACT

According to exemplary embodiments, a system, is provided for bit error rate (BER)-based wear leveling in a solid state drive (SSD). A block-level BER value for a block in the SSD is determined. An adjusted PE cycle count for the block is incremented or decremented based on the block-level BER value. Wear leveling is then performed in the SSD based on the adjusted PE cycle count.

15 Claims, 7 Drawing Sheets

(51) Int. Cl.
*G01R 31/28* (2006.01)
*H03M 13/00* (2006.01)
*G01R 31/317* (2006.01)
*G06F 11/10* (2006.01)
*G11C 16/34* (2006.01)
*G06F 11/07* (2006.01)
*G06F 11/16* (2006.01)
*G11C 11/406* (2006.01)
*G11C 16/10* (2006.01)
*G11C 16/14* (2006.01)
*G11C 16/16* (2006.01)
*G11C 29/42* (2006.01)
*G11C 29/50* (2006.01)
*H04L 1/20* (2006.01)

(52) U.S. Cl.
CPC ............ *G06F 11/16* (2013.01); *G11C 11/406* (2013.01); *G11C 16/10* (2013.01); *G11C 16/14* (2013.01); *G11C 16/16* (2013.01); *G11C 16/3404* (2013.01); *G11C 16/3409* (2013.01); *G11C 16/3468* (2013.01); *G11C 29/42* (2013.01); *G11C 29/50* (2013.01); *H04L 1/203* (2013.01)

(56) References Cited

U.S. PATENT DOCUMENTS

| | | | | |
|---|---|---|---|---|
| 8,244,961 | B2 * | 8/2012 | Luo et al. | 711/103 |
| 8,285,919 | B2 * | 10/2012 | Luo et al. | 711/103 |
| 8,296,625 | B2 * | 10/2012 | Diggs et al. | 714/762 |
| 8,316,173 | B2 * | 11/2012 | Hetzler et al. | 711/103 |
| 8,344,475 | B2 * | 1/2013 | Shaeffer et al. | 257/528 |
| 8,427,871 | B2 * | 4/2013 | Han et al. | 365/185.09 |
| 8,443,242 | B2 * | 5/2013 | Weingarten et al. | 714/704 |
| 8,453,021 | B2 * | 5/2013 | Moshayedi et al. | 714/710 |
| 8,495,281 | B2 * | 7/2013 | Iliadis et al. | 711/103 |
| 8,554,989 | B2 * | 10/2013 | Hetzler et al. | 711/103 |
| 8,595,597 | B2 * | 11/2013 | Xie et al. | 714/773 |
| 8,615,700 | B2 * | 12/2013 | Dave et al. | 714/773 |
| 8,621,328 | B2 * | 12/2013 | Franceschini et al. | 714/773 |
| 2007/0002624 | A1 | 1/2007 | Ju | |
| 2009/0113120 | A1 | 4/2009 | Murin | |
| 2009/0210758 | A1 | 8/2009 | Huang et al. | |
| 2010/0174845 | A1 * | 7/2010 | Gorobets et al. | 711/103 |
| 2010/0211833 | A1 * | 8/2010 | Weingarten | 714/704 |
| 2010/0318718 | A1 * | 12/2010 | Eilert et al. | 711/103 |
| 2011/0038205 | A1 | 2/2011 | Chou et al. | |
| 2011/0047421 | A1 * | 2/2011 | Schuette | 714/718 |
| 2011/0314354 | A1 * | 12/2011 | Fillingim | 714/760 |
| 2012/0063231 | A1 * | 3/2012 | Wood et al. | 365/185.18 |
| 2012/0066441 | A1 * | 3/2012 | Weingarten | 711/103 |
| 2012/0191927 | A1 * | 7/2012 | Gorobets et al. | 711/156 |
| 2012/0226959 | A1 | 9/2012 | Xie et al. | |
| 2012/0236656 | A1 * | 9/2012 | Cometti | 365/185.22 |
| 2012/0239858 | A1 * | 9/2012 | Melik-Martirosian | 711/103 |
| 2012/0239976 | A1 * | 9/2012 | Cometti et al. | 714/24 |
| 2012/0239991 | A1 * | 9/2012 | Melik-Martirosian | 714/708 |
| 2012/0260150 | A1 * | 10/2012 | Cideciyan et al. | 714/773 |
| 2013/0007543 | A1 * | 1/2013 | Goss et al. | 714/718 |
| 2013/0024735 | A1 * | 1/2013 | Chung et al. | 714/704 |
| 2013/0061101 | A1 * | 3/2013 | Fitzpatrick et al. | 714/718 |
| 2013/0124945 | A1 * | 5/2013 | Hu et al. | 714/773 |
| 2013/0148437 | A1 * | 6/2013 | Bronner et al. | 365/185.29 |
| 2013/0176784 | A1 * | 7/2013 | Cometti et al. | 365/185.11 |
| 2013/0179754 | A1 * | 7/2013 | Cherubini et al. | 714/773 |
| 2013/0232289 | A1 * | 9/2013 | Zhong et al. | 711/102 |
| 2013/0346812 | A1 * | 12/2013 | Bahirat et al. | 714/704 |
| 2014/0101499 | A1 * | 4/2014 | Griffin et al. | 714/706 |

OTHER PUBLICATIONS

Micron Technology, Inc., "Wear-Leveling Techniques in NANS Flash Devices," Oct. 1, 2008, Micron Technoloy, Inc., pp. 1-8.
STMicroelectronics, "Wear Leveling in Single Level Cell NAND Flash Memories," Application Note: AN1822, Nov. 2004; pp. 1-6.
E. Yaakobi, et al. "Error Characterization and Coding Schemes for Flash Memories," IEEE: Globecom 2010; 5 pages.

* cited by examiner

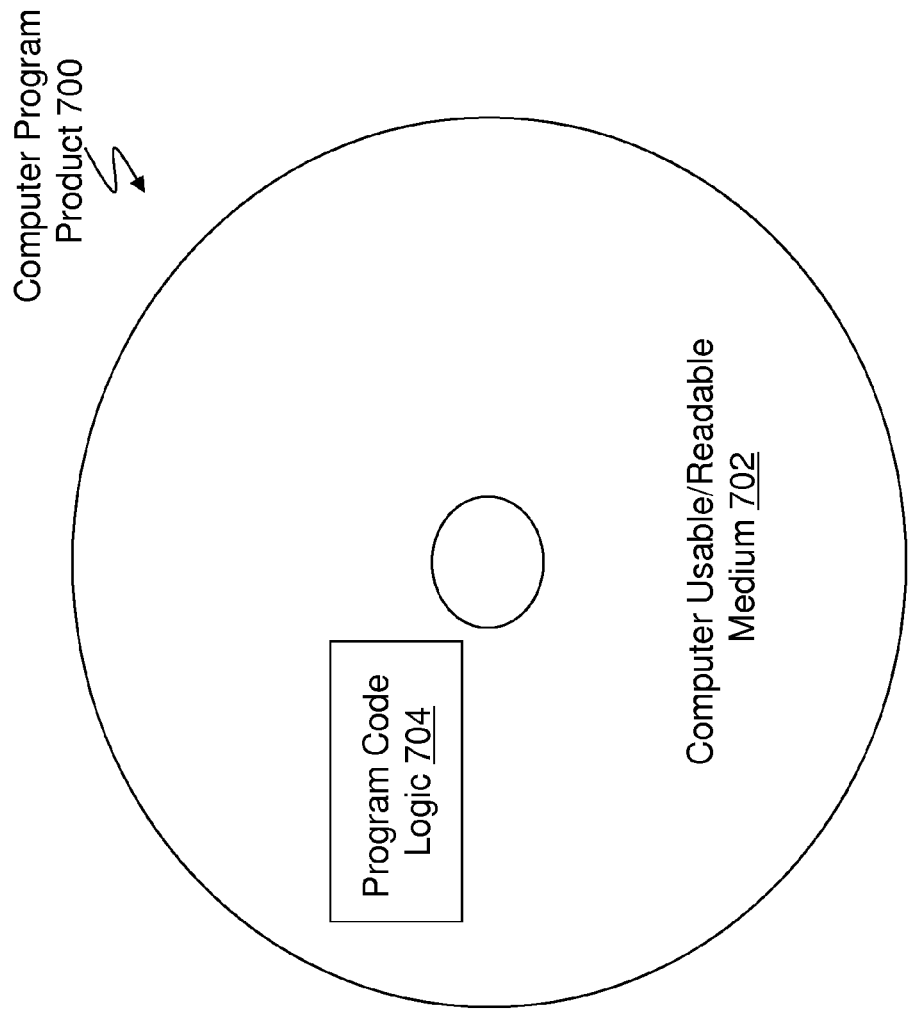

BIT ERROR RATE BASED WEAR LEVELING FOR SOLID STATE DRIVE MEMORY

CROSS-REFERENCE TO RELATED APPLICATION

This application is a continuation of U.S. application Ser. No. 13/355,050 (Griffin et al.), filed on Jan. 20, 2012, which is herein incorporated by reference in its entirety.

BACKGROUND

The present invention relates to computer memory, and more specifically, to solid state drive (SSD) memory.

SSD is may be used in place of hard disk drives (HDDs) to provide higher performance and reduce mechanical reliability issues. An SSD includes a high-speed interface connected to a controller chip and a plurality of storage, or memory, elements. The controller chip translates a high speed protocol received over the high speed interface into the protocol required by the storage elements, which include solid state memory devices (for example, semiconductor devices). An example of a type of SSD includes flash devices. The controller controls the occurrence of read and erase (i.e., program/erase cycles, or PE cycles) events in the storage elements. The storage elements in the SSD comprise a plurality of blocks, which are the smallest erasable units in the memory. The blocks are subdivided into pages, which are the smallest readable units of the memory, and pages are subdivided into sectors. In a PE cycle, all the pages in a block are erased and then some, if not all, of the pages in the block are subsequently programmed.

An issue for SSDs is the reliability of the storage elements over the life of the SSD. Over time, relatively high gate voltages applied to the storage elements during PE cycles in the SSD may cause cumulative permanent changes to the storage element characteristics. Charge may become trapped in the gate oxide of the storage elements through stress-induced leakage current (SILC). As the charge accumulates, the effect of programming or erasing a storage element becomes less reliable and the overall endurance of the storage element decreases. Additionally, an increasing number of PE cycles experienced by a storage element decreases the storage element's data retention capacity, as high voltage stress causes charge to be lost from the storage element's floating gate.

One method of prolonging the endurance and data retention capacities of a SSD is wear leveling. Wear leveling attempts to distribute PE cycling equally among all storage elements in the SSD so that all storage elements wear at similar rates and the overall lifespan of the SSD is prolonged. Another means of prolonging the endurance and data retention capacities of an SSD is using a set of storage elements including a hybrid memory array that is a mixture of higher endurance memory (i.e., single-level cell, or SLC), and lower endurance memory (i.e. multi-level cell, or MLC). In such a hybrid memory array, higher frequency accesses are mapped to addresses in the higher endurance memory and lower frequency accesses are mapped to addresses in the lower endurance memory. Such a scheme prolongs the lifetime of the overall flash memory array.

SUMMARY

According to exemplary embodiments, a system, is provided for BER-based wear leveling in a SSD. A block-level BER value for a block in the SSD is determined. An adjusted PE cycle count for the block is incremented or decremented based on the block-level BER value. Wear leveling is then performed in the SSD based on the adjusted PE cycle count.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 7 illustrates an example of a computer program product on a computer readable/usable medium with computer program code logic embodied in tangible media as an article of manufacture.

DETAILED DESCRIPTION

Figure 1:
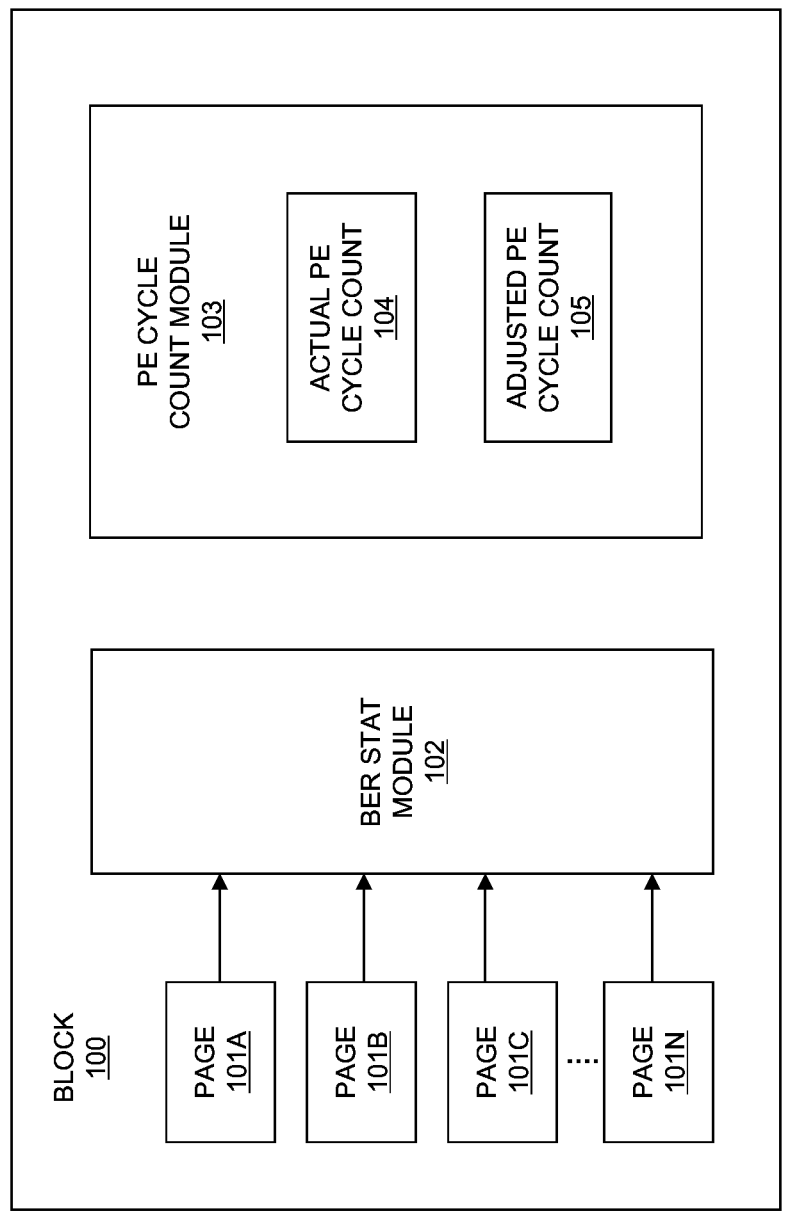
FIG. 1 illustrates a block diagram of a memory block in an SSD in accordance with an embodiment of the present invention.

Embodiments of systems and methods for bit error rate (BER) based wear leveling for an SSD are provided, with exemplary embodiments being discussed below in detail. A wear leveling scheme that manages cycling distribution among storage elements, or blocks, in the SSD solely based on PE cycle counts does not account for the blocks wearing down at different rates over the same number of PE cycles due to inherent defects or weaknesses in the various blocks. BER statistics collection at the block level of the memory elements in the SSD enhances the wear leveling scheme by taking into account the current health of the blocks as indicated by the BER. The BER statistics are collected when a read operation is performed. The health of a block unit in a SSD device is measured based on the BER. A block with a higher BER has a commensurately higher wear-down state, which is indicated by an adjusted PE cycle count for the block that reflects the BER. Therefore, blocks showing more signs of wear as indicated by the BER may be treated as more highly PE-cycled blocks regardless of actual PE cycle count or initial endurance class designation of the block. The BER statistics of a block are used to adjust the adjusted PE cycle count of the block in an incremental way, such that temporary spikes in BER due to disturb events are not disproportionately represented in the adjusted PE cycle count.

Whenever a page is read the SSD, BER statistics are calculated at the page, block, and device levels for the read event. The BER statistics may be given by error correcting code (ECC) logic. The SSD controller typically applies an ECC scheme to each sector of a page during a read event. The ECC logic can indicate the number of bits that were read in error while correcting those bits. The number of bits that can be corrected is based on the level of correct-ability of the ECC design; for example, an advanced ECC scheme used by some example flash controllers can correct up to 24 bits in a 512-byte sector. A PE cycle adjustment module receives the BER statistics for the block, determines a BER value for the block from the BER statistics, and compares the BER value to a look-up table that maps a range of expected PE cycle count values to BER values. The look-up table may be modified dynamically during operation of the SSD based on the PE cycle count and BER values observed in the SSD in some embodiments. Based on the current set of BER statistics for the block, an adjusted PE cycle count value that reflects the health of the block relative to all other blocks in the device is incremented or decremented. The actual and adjusted PE cycle counts for each block are passed to a wear leveling interface module; the actual or adjusted PE cycle count value may be used for wear leveling purposes in various embodiments. The wear leveling may comprise a standard wear leveling scheme in some embodiments, or an endurance classification scheme (in which an endurance classification of a block may be changed based on the adjusted PE cycle count) in other embodiments.

FIG. 1 shows an embodiment of a memory block 100, or block, of an SSD that incorporates BER-based wear leveling. Block 100 is made up of a plurality of pages 101A-N. Whenever a page of pages 101A-N is read, the BER statistics module 102 receives BER statistics for the page from ECC logic that is used in conjunction with the read process. Each sector in each page 101A-N may have a unique ECC logic that indicates the number of bits read in error from the sector. This ECC information for each sector is collected at the page level and passed to the BER statistics module 102. The BER statistics module 102 receives such BER statistics from each of the pages 101A-N, and calculates overall BER statistics for the block 100. These statistics may include an average BER across the pages 101A-N, a minimum and average minimum BER value of the pages 101A-N, and/or a maximum and average maximum BER value of the pages 101A-N in various embodiments. The PE cycle count module 103 stores two values: the actual PE cycle count 104, which indicates the actual number of PE cycles experienced by the block 100, and an adjusted PE cycle count 105, which is a PE cycle count that takes into account the BER statistics for the block 100. The actual PE cycle count 104 is incremented every time the block 100 is erased. The adjusted PE cycle count 105 is adjusted based on the BER statistics in the BER statistics module 102. Adjustment of the adjusted PE cycle count 105 based on the BER statistics is discussed in further detail below, and functioning of a block 100 as shown in FIG. 1 is discussed in further detail with respect to FIG. 3.

Figure 2:
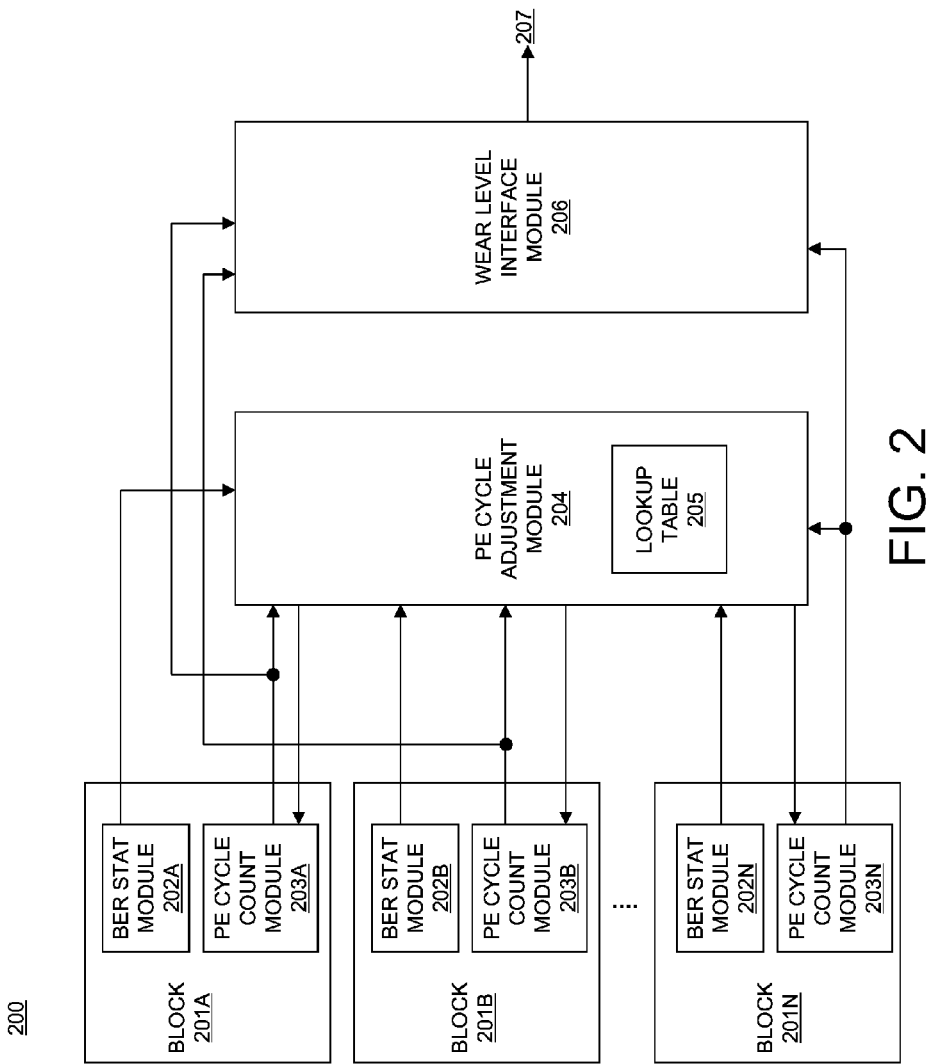
FIG. 2 illustrates a block diagram of a bit error rate (BER) based wear leveling system for an SSD in accordance with an embodiment of the present invention.

FIG. 2 shows an embodiment of a BER-based wear leveling system 200 for an SSD. BER-based wear leveling system 200 includes a plurality of blocks 201A-N, each of comprises a block such as was described with respect to block 100 of FIG. 1. The BER statistics modules 202A-N of blocks 201A-N provides BER statistics at the block level to the PE cycle adjustment module 204, and PE cycle count modules 203A-N provide the actual and adjusted PE cycle counts for each block 201A-N to the PE cycle adjustment module and the wear leveling interface module 206. The PE cycle adjustment module maintains a lookup table 205 mapping block-level BER values to expected PE cycle counts, and provides feedback signals (i.e., a PE increment signal or a PE decrement signal) to the PE cycle count modules 203A-N indicating whether the adjusted PE cycle counts stored in the PE cycle count modules 203A-N should be incremented or decremented based on the received BER statistics from the respective BER statistics modules 202A-N. This feedback from the PE cycle adjustment module 204 to a PE cycle count module of PE cycle count modules 203A-N may be triggered by an erase of the block 201A-N in which the PE cycle count module is located or by a refresh of the lookup table that results in some remapping of BER values to expected PE cycle counts. The wear leveling interface module 206 may be configured to provide either the actual PE cycle counts or the adjusted PE cycle counts for the plurality of blocks 201A-N to a wear leveling module (not shown) via output 207. The wear leveling module may comprise a standard wear leveling scheme in some embodiments, or an endurance classification scheme in other embodiments. Functioning of the PE cycle adjustment module 204 is discussed in further detail with respect to FIG. 4, and functioning of the wear leveling interface module 206 is discussed in further detail with respect to FIG. 5.

Lookup table 205 may be maintained by PE cycle adjustment module 204 based on block-level BER values and actual PE cycle counts across all blocks 201A-N. Lookup table 205 may associate a range of actual PE cycle count values for each BER value; in other embodiments, a range of expected BER values may be associated with each actual PE cycle count value. The lookup table 205 associates with each BER value a minimum expected actual PE cycle count and a maximum expected PE cycle count. The ranges of PE cycle counts given in lookup table 205 for different BER values may overlap. It is expected that for a higher BER value, the number of actual PE cycles is also higher. PE cycle adjustment module 204 may adjust and refresh the mappings in the lookup table 205 as BER and actual PE cycle count data is received during operation.

Figure 3:
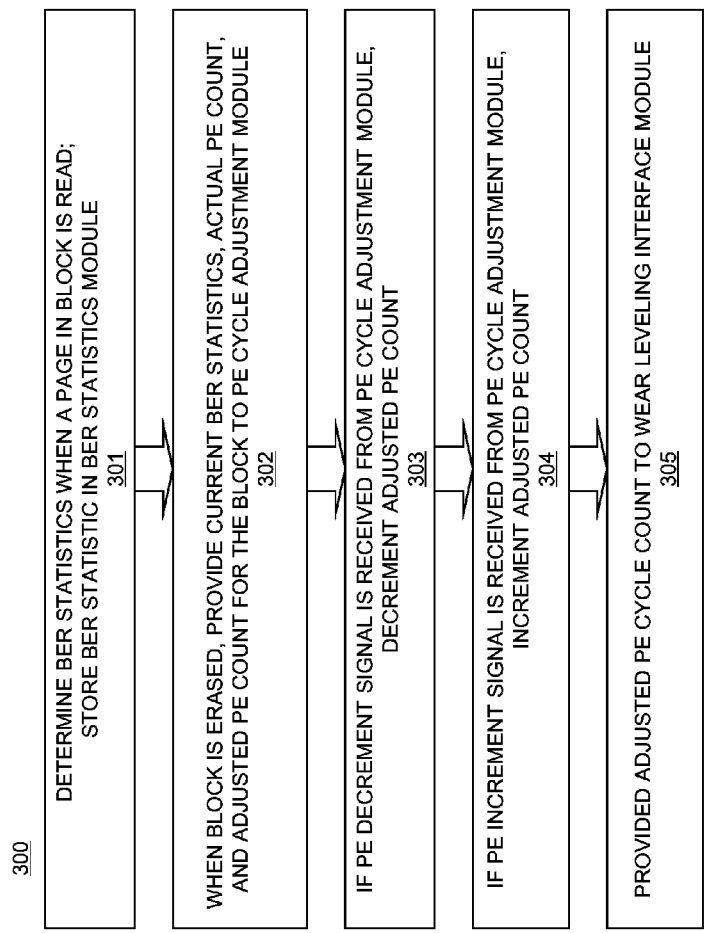
FIG. 3 illustrates a flow diagram of a process performed by a memory block in an SSD in accordance with an embodiment of the present invention.

FIG. 3 illustrates a flowchart of a method 300 of operation of a block of an SSD that incorporates BER-based wear leveling. FIG. 3 is discussed with respect to FIGS. 1 and 2. First, in block 301, one or more pages 101A-N in a block 100 (which may comprise any of blocks 201A-N) are read, and ECC data from the read event is provided to the BER statistics module 102. The BER statistics module 102 compiles this ECC data into BER statistics for the block 100. These BER statistics may include an average BER across the pages 101A-N, a minimum and average minimum BER value of the pages 101A-N, and/or a maximum and average maximum BER value of the pages 101A-N in various embodiments. The BER statistics module 102 may reflect any number of read events that occur in the block 100; for example, a set of read events that occur between erase events. Then, in block 302, the block 100 is erased. The erasure of the block 100 triggers incrementing of the actual PE cycle count 104 to reflect the erase event, and may also trigger incrementing the adjusted PE cycle count 105. After this incrementing to reflect the erase event is performed, the actual PE cycle count 104 and the adjusted PE cycle count 105 from the PE cycle count module 103 and the BER statistics in the BER statistics module 102 are provided to the PE cycle adjustment module 204. Next, in block 303, if a PE decrement signal is received by the PE cycle count module 103 from the PE cycle adjustment module 204, the adjusted PE cycle count is decremented; or, in block 304, if a PE increment signal is received by the PE cycle count module 103 from the PE cycle adjustment module 204, the adjusted PE cycle count is incremented. The incrementing or decrementing of the adjusted PE cycle count 105 may be by a set amount, for example, 1. Determination of the PE decrement and increment signals by the PE adjustment module is discussed in further detail with respect to FIG. 4. Lastly, in block 305, the adjusted PE cycle count 105, which reflects the BER statistics of the block 100, is provided to the wear leveling interface module 206 to use in a wear leveling scheme for the SSD.

Figure 4:
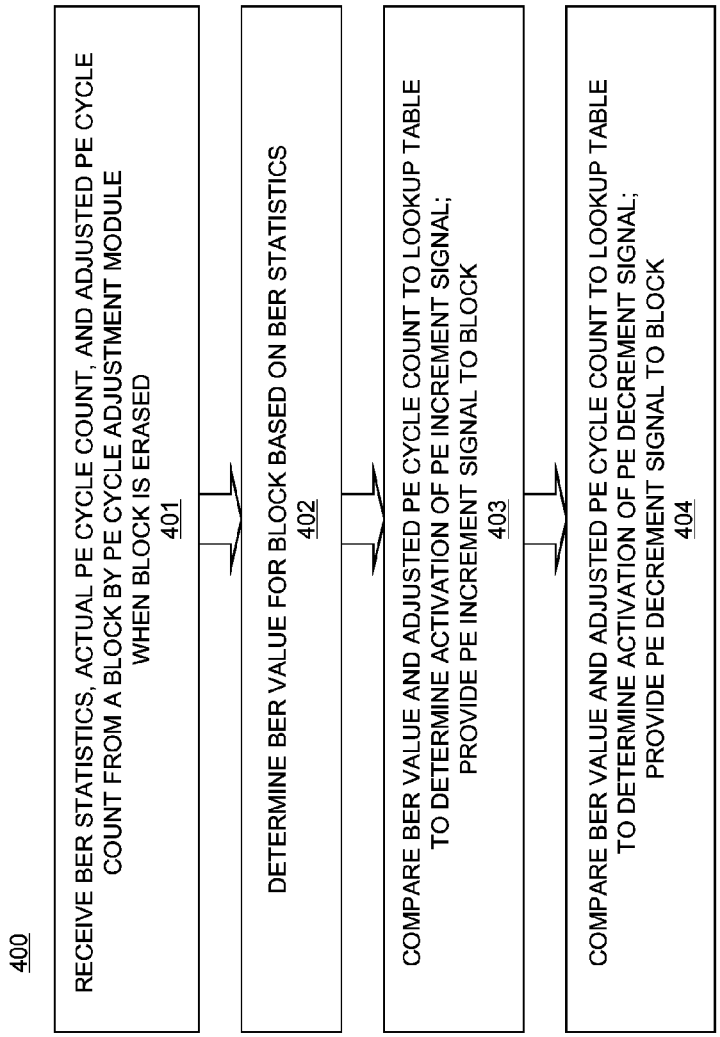
FIG. 4 illustrates a flow diagram of a process performed by a PE cycle adjustment module in an SSD in accordance with an embodiment of the present invention.

FIG. 4 illustrates a flowchart of a method 400 of operation of a PE adjustment module of an SSD that incorporates BER-based wear leveling. FIG. 4 is discussed with respect to FIGS. 1 and 2. First, in block 401, an erase event in a block 100 (i.e., one of blocks 201A-N) triggers receiving by the PE cycle adjustment module 204 BER statistics from the respective BER statistics module 102 of the block, and the actual PE cycle count 104 and adjusted PE cycle count 105 from the respective PE cycle count module 103 of the block 100. Next, in block 402, a BER value for the block is determined from the received BER statistics. The BER value and the actual PE cycle count 104 are used to help maintain the lookup table 205

Then, in block 403, the BER value and adjusted PE cycle count 105 are compared to the lookup table 205 that is maintained in the PE cycle adjustment module 204 to determine if the PE increment signal should be activated. The adjusted PE cycle count is adjusted incrementally to prevent temporary spikes in BER due to disturb events from being disproportionately represented in the adjusted PE cycle count. For each BER value, the lookup table 205 may associate a range of expected actual PE cycle count values (i.e., a minimum threshold actual PE cycle count and a maximum threshold actual PE cycle count that are expected to be observed for the particular BER value). A higher range of actual PE cycle count values is expected for a higher BER value, and the ranges may overlap between BER values. In some embodiments, the increment comparison with the lookup table 205 may be as follows. If the adjusted PE cycle count 105 for block 100 is less than the minimum threshold actual PE cycle count given by the lookup table 205 for the BER value of the block, then the PE increment signal is provided to the block 100 to increment the adjusted PE cycle count 105 of the block 100. Then, in some embodiments, the incremented adjusted PE cycle count 105 is compared to the minimum threshold actual PE cycle count plus a margin. If the incremented adjusted PE cycle count 105 is less than the minimum threshold actual PE cycle count plus the margin, the PE increment signal is provided again to the block 100 to further increment the adjusted PE cycle count 105 of the block 100. The margin may be derived on-the-fly by applying a configurable threshold percentage against the mapping width of the range associated with the BER value of the block.

Lastly, in block 404, the BER value and adjusted PE cycle count 105 are compared to the lookup table 205 that is maintained in the PE cycle adjustment module 204 to determine if the PE decrement signal should be activated. The adjusted PE cycle count is adjusted incrementally to prevent temporary spikes in BER due to disturb events from being disproportionately represented in the adjusted PE cycle count. In some embodiments, the decrement comparison with the lookup table 205 may be as follows. If the adjusted PE cycle count 105 for block 100 is greater than the maximum threshold actual PE cycle count given by the lookup table 205 for the BER value of the block, then the PE decrement signal is provided to the block 100 to decrement the adjusted PE cycle count 105 of the block 100. Then, in some embodiments, the decremented adjusted PE cycle count 105 is compared to the maximum threshold actual PE cycle count minus a margin. If the decremented adjusted PE cycle count 105 is greater than the maximum threshold actual PE cycle count minus the margin, the PE decrement signal is provided again to the block 100 to further decrement the adjusted PE cycle count 105 of the block 100. The margin may be derived on-the-fly by applying a configurable threshold percentage against the mapping width of the PE cycle count range associated with the BER value of the block.

Figure 5:
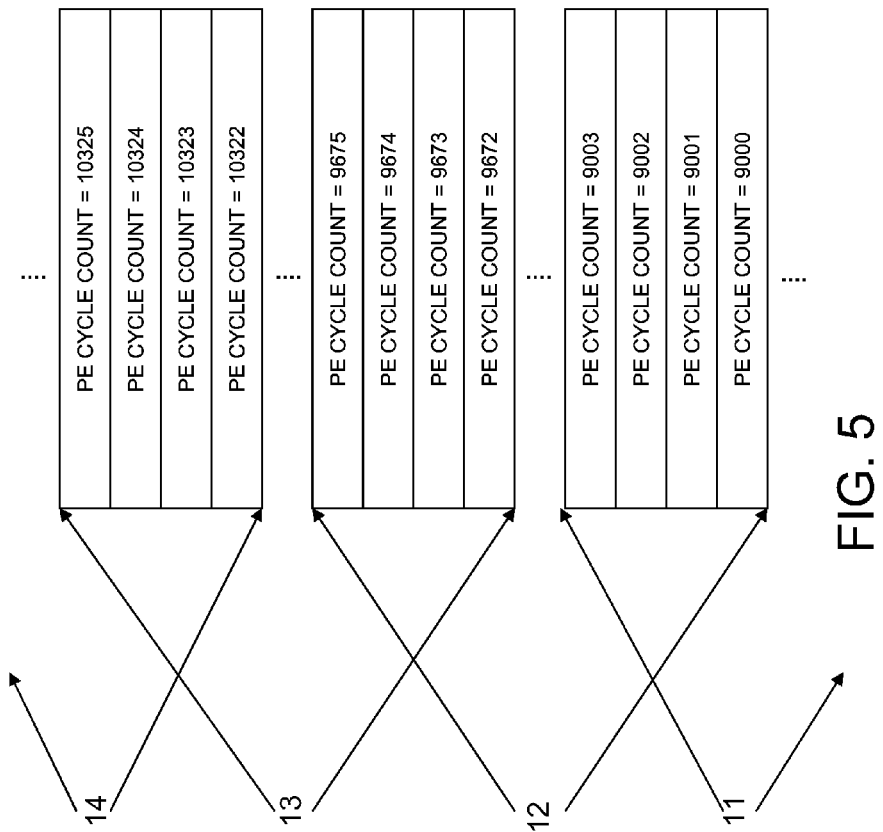
FIG. 5 illustrates an embodiment of an lookup table that may be maintained in a PE cycle adjustment module in accordance with an embodiment of the present invention.

Application of method 400 of FIG. 4 to an example block 100 is now discussed with reference to FIG. 5, which illustrates an example embodiment of a lookup table 500 which may comprise the lookup table 205 that is maintained in a PE cycle adjustment module 204. In this example, in block 401, an adjusted PE cycle count 105 of 9338 is received from block 100, along with the BER statistics for the block. In block 402, a BER value of 13 is determined from the BER statistics. In block 403, it is determined based on table 500 that the adjusted PE cycle count 105 of 9338 falls in the middle of the range of a BER value of 12. However, because the BER value of the block 100 is 13, the PE increment signal is activated until the adjusted PE cycle count 105 reaches a value of 9672, which is the minimum threshold actual PE cycle count for a BER value of 13. Further, in some embodiments, the marginal comparison is made. If the configurable threshold percentage for determining the margin is set to 50%, PE increment continues to activate until adjusted PE cycle count 105 reaches a value of 9999 so that it falls at the mid-point of the range for a BER value of 13. Lastly, flow proceeds to block 404, in which no action is taken as an adjusted PE cycle count 105 of 9670 or 9999 is lower than the maximum threshold actual PE cycle count of 10325 that is given by the lookup table 500 for a BER value of 13.

To continue the example, if at some subsequent point the BER value received from the block is 12, and the adjusted PE cycle count 105 is 9670, then, in block 404 of method 400, the PE decrement signal will be activated until adjusted PE cycle count 105 reaches a value of 9675, which is the maximum threshold actual PE cycle count given by table 500 for a BER value of 12. Further, in some embodiments, the marginal comparison is made. If the configurable threshold percentage for determining the margin is set to 50%, PE decrement continues to activate until adjusted PE cycle count 105 reaches a value of 9338, so that it falls at the mid-point of the range for a BER value of 12.

Figure 6:
FIG. 6 illustrates a flow diagram of a process performed by a wear leveling interface module in an SSD in accordance with an embodiment of the present invention.

FIG. 6 illustrates a flowchart of a method 600 of operation of a wear level interface module of an SSD that incorporates BER-based wear leveling. FIG. 6 is discussed with respect to FIGS. 1 and 2. First, in block 601, if BER-based wear leveling is turned on for the SSD that includes the wear leveling interface module 206, the wear leveling interface module 206 passes the adjusted PE cycle count 105 for each of the blocks 201A-D to the wear leveling module (not shown) of the SSD via output 207. This allows wear leveling to be performed in the SSD that takes into account the relative health of the various blocks 201A-D as indicated by their respective BER statistics. The wear leveling module may comprise a standard wear leveling scheme in some embodiments, or an endurance classification scheme in other embodiments. Alternately, in block 602, if BER-based wear leveling is turned off for the SSD that includes the wear leveling interface module 206, the wear leveling interface module 206 passes the actual PE cycle count 104 for each of the blocks 201A-D to the wear leveling module of the SSD via output 207.

As described above, embodiments can be embodied in the form of computer-implemented processes and apparatuses for practicing those processes. An embodiment may include a computer program product 700 as depicted in FIG. 7 on a computer readable/usable medium 702 with computer program code logic 704 containing instructions embodied in tangible media as an article of manufacture. Exemplary articles of manufacture for computer readable/usable medium 702 may include floppy diskettes, CD-ROMs, hard drives, universal serial bus (USB) flash drives, or any other computer-readable storage medium, wherein, when the computer program code logic 704 is loaded into and executed by a computer, the computer becomes an apparatus for practicing the invention. Embodiments include computer program code logic 704, for example, whether stored in a storage medium, loaded into and/or executed by a computer, or transmitted over some transmission medium, such as over electrical wiring or cabling, through fiber optics, or via electromagnetic radiation, wherein, when the computer program code logic 704 is loaded into and executed by a computer, the computer becomes an apparatus for practicing the invention. When implemented on a general-purpose microprocessor, the computer program code logic 704 segments configure the microprocessor to create specific logic circuits.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A system for bit error rate (BER) based wear leveling in a solid state drive (SSD), the system comprising:
   a program/erase (PE) cycle adjustment module and a plurality of blocks comprising solid state memory, the system configured to perform a method comprising:
   determining a block-level BER value for a block of the plurality of blocks;
   incrementing or decrementing an adjusted PE cycle count for the block based on the block-level BER value by the PE cycle adjustment module; and
   performing wear leveling in the SSD based on the adjusted PE cycle count by distributing PE cycling among a plurality of blocks in the SSD based on a respective adjusted PE cycle count of each of the plurality of blocks in the SSD.

2. The system of claim 1, wherein determining the block-level BER statistics for the block comprises collecting error correcting code (ECC) data from one or more read events of one or more pages in the block, and wherein determining the adjusted PE cycle count for the block based on the block-level BER value is performed in response to an erase event in the block.

3. The system of claim 1, wherein determining the adjusted PE cycle count for the block based on the block-level BER value comprises comparing the block-level BER value and the adjusted PE cycle count of the block to a lookup table, wherein the lookup table comprises a plurality of ranges of expected PE cycle count values, each of the plurality of ranges of expected PE cycle count values being mapped to a respective BER value.

4. The system of claim 3, wherein the lookup table is modified based on observed actual PE cycle count values received from the plurality of blocks by the PE cycle adjustment module.

5. The system of claim 4, wherein the adjusted PE cycle count of the block is incremented to be equal to a midpoint of the range of expected PE cycle count values given by the lookup table for the BER value of the block based on the incremented adjusted PE cycle count being lower than the minimum threshold of the range of expected PE cycle count values plus the margin.

6. The system of claim 3, wherein the adjusted PE cycle count of the block is incremented based on the adjusted PE cycle count being lower than a minimum threshold of the range of expected PE cycle count values given by the lookup table for the BER value of the block.

7. The system of claim 6, wherein the adjusted PE cycle count of the block is decremented to be equal to the maximum threshold of the range of expected PC cycle count values given by the lookup table for the BER value of the block based on the adjusted PE cycle count being higher than a maximum threshold of the range of expected PE cycle count values given by the lookup table for the BER value of the block.

8. The system of claim 3, wherein the adjusted PE cycle count of the block is incremented based on the incremented adjusted PE cycle count being lower than the minimum threshold of the range of expected PE cycle count values plus a margin.

9. The system of claim 8, wherein the adjusted PE cycle count of the block is decremented to be equal to a midpoint of the range of expected PC cycle count values given by the lookup table for the BER value of the block based on the decremented adjusted PE cycle count being higher than the maximum threshold of the range of expected PE cycle count values minus the margin.

10. The system of claim 3, wherein the adjusted PE cycle count of the block is decremented based on the adjusted PE cycle count being higher than a maximum threshold of the range of expected PE cycle count values given by the lookup table for the BER value of the block.

11. The system of claim 3, wherein the adjusted PE cycle count of the block is decremented based on the decremented adjusted PE cycle count being higher than the maximum threshold of the range of expected PE cycle count values minus a margin.

12. The system of claim 3, wherein the adjusted PE cycle count of the block is incremented to be equal to the minimum threshold of the range of expected PE cycle count values given by the lookup table for the BER value of the block based on the adjusted PE cycle count being lower than the minimum threshold of the range of expected PE cycle count values given by the lookup table for the BER value of the block.

13. The system of claim 1, further comprising maintaining both the adjusted PE cycle count for the block and an actual PE cycle count for the block by a PE cycle count module of the block.

14. The system of claim 13, further comprising:
providing the BER value for the block and the actual PE cycle count for the block from the PE cycle count module to a PE adjustment module; and
modifying a lookup table, wherein the lookup table comprises a plurality of ranges of expected PE cycle count values, each of the plurality of ranges of expected PE cycle count values being mapped to a respective BER value, based on the received BER value for the block and the received actual PE cycle count for the block by the PE adjustment module during operation of the SSD.

15. The system of claim 13, further comprising:
based on BER based wear leveling being enabled for the SSD, providing the adjusted PE cycle count to a wear leveling module that performs the wear leveling, and performing wear leveling by the wear leveling module based on the adjusted PE cycle count; and
based on BER based wear leveling not being enabled for the SSD, providing the actual PE cycle count to the wear leveling module that performs the wear leveling, and performing wear leveling by the wear leveling module based on the actual PE cycle count.

* * * * *